(12) United States Patent
Guido et al.

(10) Patent No.: US 7,141,135 B2
(45) Date of Patent: Nov. 28, 2006

(54) MANUFACTURING METHOD OF PHOSPHOR OR SCINTILLATOR SHEETS AND PANELS SUITABLE FOR USE IN A SCANNING APPARATUS

(75) Inventors: Verreyken Guido, Edegem (BE); Bluys Peter, Ranst (BE); Hendrickx Rudy, Booischot (BE); Peeters Lucas, Hove (BE); Lamotte Johan, Rotselaar (BE)

(73) Assignee: Agfa-Gevaert, Mortsel (BE)

( * ) Notice: Subject to any disclaimer, the term of this patent is extended or adjusted under 35 U.S.C. 154(b) by 239 days.

(21) Appl. No.: 10/804,539

(22) Filed: Mar. 19, 2004

(65) Prior Publication Data
US 2004/0224084 A1 Nov. 11, 2004

(30) Foreign Application Priority Data
Mar. 20, 2003 (EP) .................................. 03100723

(51) Int. Cl.
*B32B 37/00* (2006.01)
(52) U.S. Cl. ...................... 156/250; 156/285; 156/344; 427/69; 427/331
(58) Field of Classification Search ................ 156/250, 156/272.2, 272.6, 278, 344, 379.6, 510, 584; 427/69, 331
See application file for complete search history.

(56) References Cited

U.S. PATENT DOCUMENTS

| | | | | |
|---|---|---|---|---|
| 3,838,273 | A | 9/1974 | Cusano | 250/213 VT |
| 3,859,527 | A | 1/1975 | Luckey | 250/327 |
| 4,449,478 | A | 5/1984 | Kraus | 118/720 |
| 4,769,549 | A | 9/1988 | Tsuchino et al. | 250/484.1 |
| 5,055,681 | A | 10/1991 | Tsuchino et al. | 250/327.2 |
| 5,460,853 | A * | 10/1995 | Hintz et al. | 427/255.5 |
| 6,402,905 | B1 | 6/2002 | Baldwin et al. | 204/192.13 |

(Continued)

FOREIGN PATENT DOCUMENTS

EP 0 574 020 12/1993

(Continued)

OTHER PUBLICATIONS

European Search Report, EP 03 10 0723, Apr. 23, 2003, Kiliaan.

(Continued)

*Primary Examiner*—James Sells
(74) *Attorney, Agent, or Firm*—Joseph T. Guy; Nexsen Pruet, LLC

(57) ABSTRACT

In a method for homogeneously and dust-free coating of a phosphor or a scintillator layer onto a flexible substrate, in order to obtain a plurality of phosphor or scintillator sheets or panels having flexible supports or substrates, a coating procedure within a sealed zone is performed, wherein said zone comprises at least two cylindrical carrier rollers for carrying a flexible substrate exceeding dimensional formats of desired phosphor or scintillator sheets or panels with a factor of at least 5, wherein said cylindrical carrier rollers each have an axis in a parallel arrangement with one another; wherein said zone comprises at least one crucible containing a mixture of raw materials providing desired phosphor or scintillator compositions for said layer; and wherein said zone comprises a laminating unit; wherein said method comprises the steps of mounting said flexible substrate onto said carrier rollers, vapor depositing said phosphor or scintillator layer having a desired phosphor or scintillator composition onto said flexible substrate, and laminating said phosphor or scintillator layer, thereby covering said layer with a protective foil; further comprising the step of cutting said layer into sheets or panels having desired formats, and wherein at least during said vapor depositing step said zone is maintained under vacuum conditions as a vacuum chamber.

75 Claims, 2 Drawing Sheets

U.S. PATENT DOCUMENTS

2003/0024479 A1    2/2003    Kashiwaya et al. ......... 118/726

FOREIGN PATENT DOCUMENTS

| EP | 1 113 458 | 7/2001 |
|----|-----------|--------|
| GB | 2 339 800 | 2/2000 |
| WO | 01/03156  | 1/2001 |

OTHER PUBLICATIONS

Schweizer et al., "RbBr and CsBr doped Eu2+ as new competitive X-ray storage phosphors" Radiation Measurements, Elsevier Sciences Publishers, Barking, GB, vol. 33, No. 5, Oct. 2001, pp. 483-486.

* cited by examiner

MANUFACTURING METHOD OF PHOSPHOR OR SCINTILLATOR SHEETS AND PANELS SUITABLE FOR USE IN A SCANNING APPARATUS

FIELD OF THE INVENTION

The present invention relates to a particular method of continuously, on-line coating of a layer from a vapor flow of raw materials on a flexible substrate. More particularly the present invention relates to the manufacturing or production of scintillator or phosphor sheets, used in screens, panels or plates suitable for use in high energy radiation detection and imaging and, more particularly, in computed radiography, screen/film radiography and direct radiography.

BACKGROUND OF THE INVENTION

In radiography the interior of objects is reproduced by means of penetrating radiation, which is high energy radiation also known as ionizing radiation belonging to the class of X-rays, γ-rays and high-energy elementary particle rays, e.g. β-rays, electron beam or neutron radiation.

For the conversion of penetrating radiation into visible light and/or ultraviolet radiation "luminescent" substances, called "phosphors", are used. Cathodoluminescent phosphors employed e.g. in CRT screens exhibit two related luminescent characteristics: fluorescence and phosphorescence. Fluorescence is the luminescent build-up or emission of light released from the phosphor during the time of electron beam excitation. Phosphorescence is the emission of light from the phosphor occurring after the cessation of electron beam excitation. The duration of phosphorescence, or rate of decay of afterglow, is denoted as persistence, usually expressed as a measurement of time required for the phosphorescence in order to reduce or decay to a ten percent level of steady state fluorescent brightness.

In known X-ray image intensifiers for example as disclosed in U.S. Pat. No. 3,838,273, the input screen comprises a substrate such as glass or aluminum on which is deposited an X-ray sensitive radiation conversion layer, commonly referred to as a fluorescence layer or scintillator.

In a conventional radiographic system an X-ray radiograph is obtained by X-rays transmitted imagewise through an object and converted into light of corresponding intensity in a so-called intensifying screen (X-ray conversion screen) wherein phosphor particles absorb the transmitted X-rays and convert them into visible light and/or ultraviolet radiation to which a photographic film is more sensitive than to the direct impact of X-rays. In practice the light emitted imagewise by said screen irradiates a contacting photographic silver halide emulsion layer film which after exposure is developed to form therein a silver image in conformity with the X-ray image.

As described e.g. in U.S. Pat. No. 3,859,527 an X-ray recording system has meanwhile been developed wherein photostimulable storage phosphors are used having, in addition to their immediate light emission (prompt emission) on X-ray irradiation, the property to store temporarily a large part of the X-ray energy. Said energy is set free by photostimulation in the form of fluorescent light different in wavelength from the light used in the photostimulation. In said X-ray recording system the light emitted on photostimulation is detected photoelectronically and transformed into sequential electrical signals. A storage screen or panel coated with such phosphors is exposed to an incident pattern-wise modulated X-ray beam and as a result thereof energy is temporarily stored in the coated storage phospors, corresponding with the X-ray radiation pattern. At some interval after the exposure, a beam of visible or infra-red light scans the panel in order to stimulate the release of stored energy as light that is detected and converted to sequential electrical signals which are processed to produce a visible image. Stimulation light can be transformed into an electric signal by making use of a photoelectric conversion element such as e.g. a photo-multiplier. It is clear that the phosphor should store as much as possible of the incident X-ray energy and emit as little as possible of the stored energy until stimulated by the scanning beam. This is called "digital radiography" or "computed radiography".

Recently, in the hospitals the tendency is increasing to obtain X-ray images on computer monitor immediately after X-ray exposure of the patient. By storing and transmitting that digitized information efficiency and speed of diagnosis is enhanced. Accordingly "direct radiography" providing directly digital diagnostic X-ray images, after exposure of an adapted detector panel in a radiographic apparatus, becomes preferred instead of the conventional screen/film system. The X-ray quanta are transformed into electric signals by making use of a solid-state flat detector as "image pick-up" element. Such a flat detector is commonly called a "flat panel detector" and is two-dimensionally arranged. Making use therein of a photoconductive material as a detecting means, such as a-Se, in which the negative electrical charge of an electron and the positive electrical charge of a hole are generated by the X-ray energy, said X-ray energy is directly converted into those separated electrical charges. The electrical charge thus obtained is read out as an electric signal by the read-out element, two-dimensionally arranged in a fine area unit.

Furtheron an indirect type flat panel detector is known, in which the X-ray energy is converted into light by a scintillator, and in which the converted light is converted into the electric charge by the photoelectric conversion element such as a-Si two-dimensionally arranged in a fine area unit. The electrical charge is read out again as an electric signal by the photoelectric conversion read-out element, two-dimensionally arranged in a fine area unit.

Moreover a direct radiography detector is known in which the X-ray energy is converted into light by a scintillator, and wherein the converted light is projected on one or more CCD or CMOS sensors which are arranged matrix-wise in the same plane, through a converging body such as a lens or optical fiber. In the inside of the CCD or CMOS sensor, via photoelectric conversion, and charge-voltage conversion, an electric signal is obtained in every pixel. This type of detector is also defined, therefore, as a solid state plane detector.

The image quality that is produced by any radiographic system using phosphor screen or panel, and more particularly, within the scope of the present invention, in a digital radiographic system, largely depends upon the construction of the phosphor screen. Generally, the thinner a phosphor screen at a given amount of absorption of X-rays, the better the image quality will be. This means that the lower the ratio of binder to phosphor of a phosphor screen, the better the image quality, attainable with that screen or panel, will be. Optimum sharpness can thus be obtained when screens without any binder are used. Such screens can be produced, e.g., by physical vapor deposition, which may be thermal vapor deposition, sputtering, electron beam deposition or other of phosphor material on a substrate. Such screens can also be produced by chemical vapor deposition. However, this production method can not be used to produce high quality screens with every arbitrary phosphor available. The mentioned production method leads to the best results when phosphor crystals with high crystal symmetry and simple chemical composition are used. So in a preferred embodiment use of alkali metal halide phosphors in storage screens or panels is well known in the art of storage phosphor radiology and the high crystal symmetry of these phosphors makes it possible to provide structured, as well as binderless screens.

It has been disclosed that when binderless screens with an alkali halide phosphor are produced it is beneficial to have the phosphor crystals deposited as some kind of piles or pillar-shaped blocks, needles, tiles, etc., in order to increase the image quality that can be obtained when using such a screen. In U.S. Pat. No. 4,769,549 it is disclosed that the image quality of a binderless phosphor screen can be improved when the phosphor layer has a block structure, shaped in fine pillars. In U.S. Pat. No. 5,055,681 a storage phosphor screen comprising an alkali halide phosphor in a pile-like structure is disclosed. In EP-A 1 113 458 a phosphor panel provided with a selected vapor deposited CsBr:Eu phosphor layer is disclosed, wherein the binderless phosphor is present as fine needles in favor of an optimized image quality.

It is clear that, from a point of view of homogeneity of layer thickness and chemical composition of the scintillator, in favor of a constant speed, image quality and diagnostic reliability, it is of utmost importance to provide said constant composition and layer thickness over the whole two-dimensional panel surface in the production of the storage phosphor plates. A homogeneous coating is profile should thus be strived for.

Manufacturing procedures making use of deposition techniques as in U.S. Pat. No. 4,449,478 wherein an arrangement for coating substrates in an apparatus for vacuum deposition comprises a rotatable substrate holding structure in a form of a plate, provide coated panels limited in number and in coated surface. Moreover, when square or rectangular panels are desired, quite a lot of expensive residue is created while not being deposited onto the plate, rotating with a circular symmetry above the vapor source. In addition, when depositing material from a fixed source onto such a rotating substrate, it is difficult to obtain a layer with a constant thickness. Circles on the substrate, having the rotation axis as centre will have identical deposition history. This creates a centro-symmetric thickness profile, which means that the thickness of the deposited layer is constant along neither of the sides of a rectangular substrate, unless special precautions are taken, e.g. use of a mask which will however lead to material losses.

Manufacturing procedures making use of deposition techniques as in US-Application 2003/0024479 wherein an arrangement for coating rigid substrates, batch wise (plate per plate) in an apparatus for vacuum deposition comprises a substrate holder conveyed from a loading chamber to an unloading chamber by a conveying mechanism, provide coated panels limited in process yield. Another batch process has been described in U.S. Pat. No. 6,402,905, where commonly a vapor deposition coating process is applied by which vapor is deposited onto a substrate that rotates around one axis that is perpendicular to the deposition area, as commonly applied in the state of the art, and wherein a system and method for controlling and compensating unevenness of the deposition thickness distribution on a substrate has been described.

In such a batch process a coating failure will generally lead to the complete loss of a panel. Moreover there will always be a high loss of raw materials in such batch processes.

Lack of deformability of the substrate also limits the format of the coating of a phosphor or scintilator layer on a substrate to the largest cross section of the vacuum deposition chamber. A solution in order to provide a method for producing phosphor or scintillator plates or panels, wherein the layer thickness in the manufacturing process is constant over large surface areas, so that phosphor plates of differing tailor-made sizes are available, has been given in EP-Application No. 03 100 723, filed Mar. 20, 2003, the contents of which is entirely incorporated herein by reference. That process was resulting in a high process yield from the same deposition process, thus providing a method for producing phosphor or scintillator plates or panels on very large flexible substrates, cutting these large areas in desired formats and protecting these flexible plates or panels against physical, chemical or mechanical damage, or a combination thereof. Although many measures have been described therein, it is of utmost importance to have the panel free from dust or dirt, in favor of diagnostic imaging quality, more particularly when screens, plates or panels ready-for-use in a scanning apparatus in computed radiography, screen/film radiography and direct radiography of all formats are envisaged.

OBJECTS AND SUMMARY OF THE INVENTION

Therefore it is an object of the present invention to provide a method to prepare phosphor or scintillator plates, wherein said plates, prepared from large area plates, show further improved homogeneity in speed and sharpness over the whole area of the said large area plates, and wherein, irrespective of their dimensions when ready-for-use, those plates or panels are free of defects, due to dust or dirt, generated during vapor deposition and/or afterwards after cutting into plates having the desired dimensions.

Other objects will become apparent from the description hereinafter.

The above-mentioned advantageous effects have been advantageously realized by a particular manufacturing method having the specific features set out in claim 1. Specific features for preferred embodiments of the invention are set out in the dependent claims and in the drawings.

Further advantages and embodiments of the present invention will become apparent from the following description and drawings.

BRIEF DESCRIPTION OF THE DRAWINGS

Following Figures represent an illustration of different embodiments of configurations related with the substrate to be coated and the apparatus wherein the coating process takes place. It is clear that these Figures, showing preferred embodiments of the coating methods according to the present invention, are in no way limited thereto.

Figure 1:
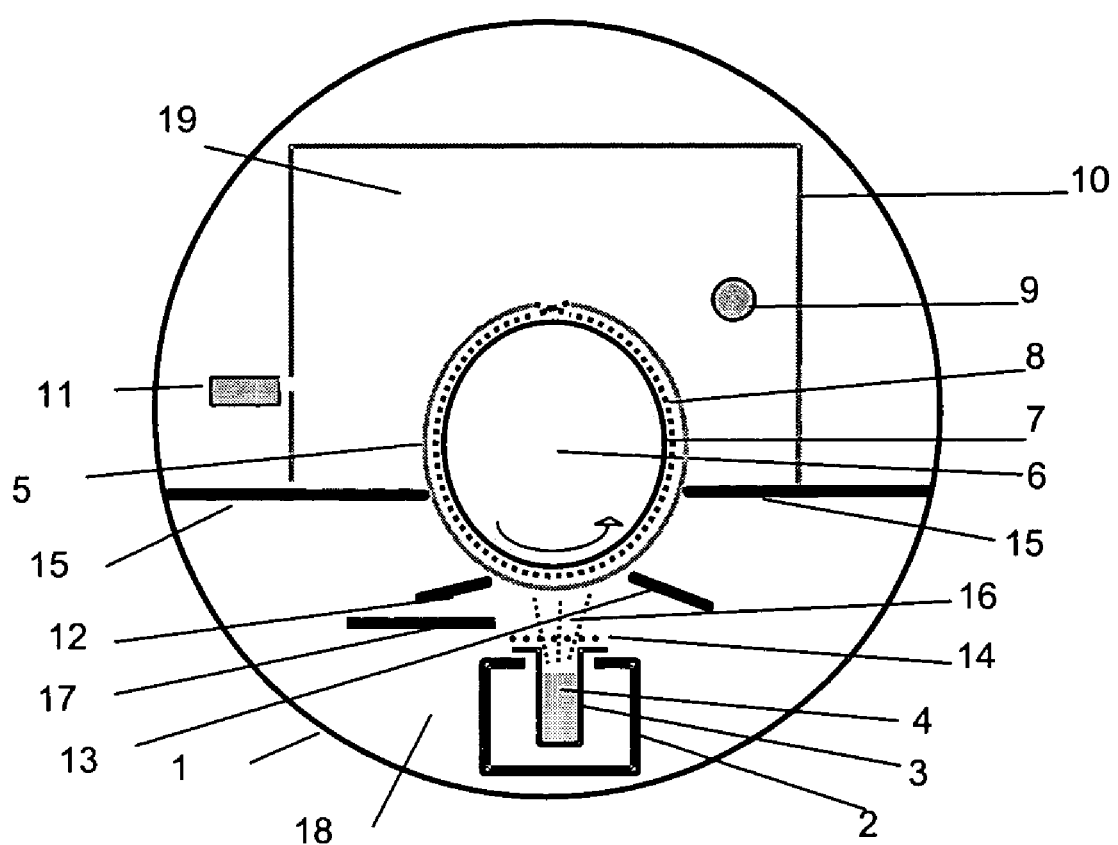
FIG. 1 is known from EP-Application No. 03 100 723, filed Mar. 20, 2003, the contents of which is entirely incorporated herein by reference, and shows, as a comparative arrangement, a cylindrical vacuum chamber (1), containing an electrically heated oven (2) and a refractory crucible, tray or boat (3) containing a mixture of raw materials (4) which should be vaporized in order to be deposited onto a flexible sheet (5). The flexible sheet (5) is supported by a cooled—supporting—roller (6), thermally isolated from said flexible sheet (5) by a thermal isolation layer (7) and by heat-resisting coiled springs (8) mounted circumferentially onto said cylinder, further interconnecting both ends of said flexible sheet (5). Heating of said flexible sheet (5) proceeds by means of infrared heater (9) and reflector cage (10). Pyrometer (11) allows measurement of the temperature. The flexible sheet (5) is moving continuously or discontinuously in a forward direction through a vapor stream (16) provided by the heated mixture of raw materials (4) as a source for said vapor stream (16). Baffles (12) and (13) restrict vapor deposition to a selected part of sheet (5), mounted onto the roller (6). Refractory boat or tray (3) is covered with metallic raster (14), which avoids formation of pits (and unevenness) on the coated phosphor layer, deposited onto the flexible sheet (5). A cooled baffle (17) may be moved to shut off the surface to be coated from or expose the surface to be coated to the vapor stream. Optionally there can be a separation (15) between the evaporation part (18) and the heating part (19).

Particular parts present in order to reach the object of avoiding dust or dirt are the protecting foil (29) of substrate support (5) that is removed, when present on the flexible substrate support sheet (5) before vapor depositing the phosphor or scintillator layer. That protective foil is wound up and collected upon roller (24), before, optionally, applying corona discharge in order to further remove dust or dirt residues and before starting vapor deposition.

The suction table (30) acting as a means in order to position the substrate web onto the rollers, is further used to provide correct positioning of the protecting laminate foil (37) provided by unwinding roller (23) and applied via lamination unit (36) after phosphor or scintillator deposition. In a particular embodiment the laminate release foil (46) of a laminate package consisting of a laminate layer (37), a release foil (46) and an adhesive layer in between is guided over guiding rollers (45) and wound up over the same delamination collecting roller for the initial delaminate foil present on the substrate support sheet (5).

Particular parts present in order to reach the object of further improving homogeneity of vapor deposition are the heating systems: besides those already mentioned in order to maintain the temperature within the crucibles at a level in order to avoid condensation of scintillator or phosphor material onto the walls of the chimney (26) a heat shield (41) with a slit in order to let the vapors pass therethrough acts as another source maintaining the temperature at the high desired level.

In favor of homogeneity of deposition another important part is the reflector cage (10) avoiding loss of heat within the sealed zone: its spatial arrangement has been optimized in order to avoid further excessive measures in favor of homogeneity of deposition and reproducibility. Nevertheless another important part is the cooling unit (39) providing an "off" and an "on" position in order to have sufficient heat in the support: once the phosphor starts to deposit the cooling is switched to an "on" position as substrate temperature increases, while further decrease while cooling is compensated by switching to an "off" position as will further be explained in the examples.

Controlling and steering parts as thermocouples (43) in contact with the outside crucible wall and (tantalum) protected thermocouples inside the crucible (44) under the raw phosphor or scintillator material level and in the vicinity of the lamps.

An important controlling part is the thickness measuring system (22), determining the thickness of the vapor deposited scintillator or phosphor layer, based on capacitance measurements.

Furtheron one or more pressure regulating cylinder(s) (31) for controll and regulation of tension on the substrate support sheet (5), during the whole procedure is present.

DETAILED DESCRIPTION OF THE INVENTION

Within the scope of the present invention a method for coating is provided of a phosphor or a scintillator layer onto a flexible substrate, within a sealed zone maintained under vacuum conditions—also called "vacuum chamber"—, by the step of vapor deposition in a coating zone onto said flexible substrate, wherein said phosphor or scintillator layer is, preferably continuously deposited onto said flexible substrate, in a configuration wherein said flexible substrate is mounted onto and guided over at least two rollers.

Within the scope of the present invention the term "flexible substrate" has to be understood as "reversably deformable supporting or supported layer in form of a sheet, web or roller", the surface area of which has to be coated with a phosphor or scintillator material. Such a substrate is meant to be present as a flexible sheet or panel.

According to the method of the present invention a plurality of phosphor or scintillator sheets or panels having flexible supports or substrates is provided by coating a phosphor or scintillator layer within a sealed zone, wherein said zone comprises at least two cylindrical carrier rollers for carrying a flexible substrate exceeding dimensional formats of desired scintillator sheets or panels with a factor of at least 5, wherein said cylindrical carrier rollers each have an axis in a parallel arrangement with one another; wherein said zone comprises at least one crucible containing a mixture of raw materials providing desired phosphor or scintillator compositions for said layer; and wherein said zone comprises a laminating unit; wherein said method comprises the steps of mounting said flexible substrate onto said carrier rollers, vapor depositing said phosphor or scintillator layer having a desired phosphor or scintillator composition onto said flexible substrate, and laminating said phosphor or scintillator layer by a laminating step, thereby covering said layer with a protective foil; further comprising the step of cutting said layer into sheets or panels having desired formats, and wherein at least during said vapor depositing step said zone is maintained under vacuum conditions as a vacuum chamber. Desired formats are e.g. well-known areas of 14"×17" (35.6 cm×43.2 cm) as being commercially available, but are in no way limited hereto.

In order to fully reach the objects of the present invention, accordingly said sealed zone further comprises a delaminating unit, and a step of delaminating said flexible substrate, when provided with an initial protective laminate foil, is included, before said step of vapor depositing said phosphor or scintillator composition.

According to the method of the present invention said steps of laminating said phosphor or scintillator layer and said step of delaminating said flexible substrate are both performed under vacuum conditions.

As a substrate material use can be made of glass, a ceramic material, a polymeric material or a metal; more preferably a material selected from the group consisting of glass, polyethylene therephthalate, polyethylene naphthalate, polycarbonate, polyimide, aluminum, Pyrex®, polymethylacrylate, polymethylmethacrylate, sapphire, zinc selenide, Zerodur®, a ceramic layer and a metal or an alloy selected from the group of aluminum, steel, brass and copper. It should even not be limited thereto as in principle, any metal or synthetic material resisting irreversible deformation, e.g. as by melting, after addition of energy to the extent as commonly applied in the coating process of the present invention, is suitable for use. Particularly preferred as flexibly moving substrate in method of the present invention is aluminum as a very good heat conducting material allowing a perfect homogeneous temperature over the whole substrate. As particularly useful aluminum substrates, without however being limited thereto, brightened anodized aluminium, anodized aluminium with an aluminium mirror and an oxide package and, optionally, a parylene layer; and anodized aluminium with a silver mirror and an oxide package and, optionally, a parylene layer; available from ALANOD, Germany, are recommended.

So according to the method of the present invention said flexible substrate support is an anodized aluminum support layer, covered with a protective foil.

According to the method of the present invention said anodized aluminum support layer has a thickness in the range of from 50 to 500 μm, and more preferably in the range from 200 to 300 μm. Such an anodized aluminum substrate has shown to be particularly favorable with respect to adhesion characteristics with respect to vapor deposited phosphors or scintillators and even bending of that flexible aluminum support coated with a scintillator layer having a thickness of 500 μm up to 1000 μm, does not cause "cracks" or delamination of scintillator or phosphor "flakes": no problems have indeed been encountered with respect to occurrence of undesirable cracks when prepared according to the method of the present invention.

The mounting step preferably proceeds by means of a suction table (30) wherein tension controll on the flexible substrate proceeds by regulating (air) pressure cylinders (31) that push up one roller in case of a configuration with 2 rollers, one (upper) roller present above the other (lower) roller.

According to the method of the present invention in said mounting step two ends of the substrate support are glued together with a heat resistant adhesive, with one or more (e.g. a couple of) rivets or with a combination thereof.

According to the method of the present invention one carrier roller is rotating, in a controlled way, by means of a motor around its axis, whereas other roller(s) is(are) rotating by movement of said one roller; and wherein while rotating, the position of the flexible substate on the rollers is controlled by means of an optical positioning sensor, coupled back to pressure regulating cylinder(s), providing position adjustment of said flexible substrate.

According to the method of the present invention said protective laminate foil, initially laminated onto the said flexible substrate, is removed in said delaminating step, once said flexible substrate has been put on tension.

According to the method of the present invention said protective laminate foil is removed under vacuum by delamination, making use of a delamination unit present in the vacuum chamber. Said foils are e.g. polymeric foils as e.g. polyethylene foils, polyimide foils and polyester foils, without however being limited thereto.

According to the method of the present invention said carrier rollers are thermally isolated from said flexible substrate support by means of a thermal isolation layer and/or a plurality of heat-resistant coiled springs, mounted over the length of the cylinders in such a way that the said coiled springs make an angle in the range of 20° to 40° with a line, parallel with the axis of said cylindrical carrier rollers. More preferably, said coiled springs make an angle in the range of 25° to 35°, and even more preferably an angle of about 30° is envisaged.

The more space is left free in the vacuum chamber, the more control sites are available. Free space can be provided e.g. with heat controlling means and sensors for temperature controll at different sites, with regard to optimize homogeneous vapor deposition onto the moving flexible support. Otherwise, means in order to locally enhance the temperature, by heating as e.g. by infrared radiation, is provided in the vacuum chamber, where free space allows such installation (e.g. in the neighbourhood of the rollers, or whatever a critical site within the vacuum chamber).

According to the method of the present invention during said vapor depositing step the temperature of the said flexible substrate is maintained in the range from 150° C. to 300° C., more preferably in the range from 150° C. to 250° C. and still more preferably in the range from 180° C. to 220° C., envisaging a target temperature of about 200° C., by means of regulable heaters and by an adressable cooling unit installed along the support. As heaters, infrared heaters are advantageously used. More particularly use is made of large quartz lamps, arranged horizontally, e.g. longitudinally, along the said substrate with a reflecting screen behind it. A vertical arrangement is not excluded however. As additional infrared heaters at least two smaller quartz lamps with a reflecting screen behind are used at the edges of the flexible substrate, in order to reduce temperature differences between the middle and the edges of said substrate. Said additional lamps are advantageously arranged in order to make an angle of about 60° with the large longitudinal quartz lamp. Furtheron a battery of small lamps is advantageously used, as described in an additional experiment in the examples hereinafter.

According to the method of the present invention said cooling unit is build up of a black body cooling element, cooled with water at room temperature on the backside, and of an addressable (opened or closed) screen of louvers in form of multiple slats on the front or support side of said cooling element. In one embodiment thereof the said slats are placed with their long side along the moving direction of the support, partly overlapping each other, thereby providing ability to be reflective ("cooling-off") on the front side, and ability to become rotated altogether along their long axis ("cooling-on"). According to the present invention said temperature is measured and registrated and a temperature profile over the whole width of said flexible substrate is used as input for steering substrate heating and/or substrate cooling.

According to the method of the present invention said temperature is measured over the whole width of said flexible substrate by means of a set of pyrometers. In one embodiment said pyrometers are lens based pyrometers with a parabolic reflector on top. In a preferred embodiment thereof said reflector is a gold evaporated mirror, wherein each focus of the said parabolic reflector is arranged in order to coincide with each focus of the corresponding pyrometer lens.

Means in order to controll layer thickness of deposited material are advantageously installed in order to stop the deposition process when the desired thickness is attained. So according to the method of the present invention said sealed zone further comprises as a controlling part a thickness measuring system, determining thickness while vapor depositing said scintillator or phosphor layer, wherein said measuring system is based on capacitance measurements.

According to the method of the present invention the said flexible substrate is spatially surrounded by a reflector cage for heat radiation.

According to the method of the present invention said protective foil, provided by the step of laminating said foil after depositing said phosphor or scintillator layer is a temporary protection layer removed by a delaminating step before or after cutting; or a lasting protective foil layer. Lamination steps advantageously make use of the suction table (30), already used before during positioning of the initial substrate web.

In a preferred embodiment delamination proceeds by making use of a delamination forerunner (34), mounted by means of one or more rollers (35) to a delamination upwinding roller (33). In another embodiment delamination proceeds by hooking or fastening the said protective laminate foil on the said delamination unit.

According to a further aspect of the method of the present invention, said protective foil, provided by the step of laminating said foil after depositing said phosphor or scintillator layer is a lasting protection layer, wherein said lasting protection layer is provided from a protection layer package, comprising a release layer that is removed in a further delaminating step and that is winded up on an upwinding roller.

According to a particular embodiment thereof in the method of the present invention said protective foil, provided by the step of laminating said foil after depositing said phosphor or scintillator layer is a lasting protection layer, wherein said lasting protection layer is provided from a protection layer package, comprising a release layer removed in a further delaminating step by means of the same delaminating unit used during the delaminating step of said flexible substrate, when initially provided with a protective laminate foil. Such a protection layer in the lamination package is advantageously consisting of polymer layer with an adhesive layer at one side, and a release layer at the other side. Preferred release layers, also called release liners, are e.g. siliconized polyethylene terephthalate release layers, in contact with an adhesive layer, whereas the protection foil is a polymer foil as, e.g. a polyethylene foil, a polyester foil or a polyimide foil, without however being limited thereto. The lamination package advantageously passes the laminate unit (36) with mechanism for supplying laminate foil and the protective foil is delaminated from the release layer in order to become laminated onto the vapor deposited phosphor layer. As this operation advantageously proceeds in vacuum the phosphor layer remains free from dust and dirt, corresponding with the objects of the present invention. The release layer is further guided over the guiding rollers (45) to the same delamination collecting roller as has been available for delamination of the initial laminate present on the protected substrate support. It is clear that more particularly presence of an initial laminate on the substrate support is envisaged in order to fully reach the objects of the present invention. So advantage is obtained by starting with e.g. a polyethylene protected anodized aluminum substrate support, without however limiting it thereto.

According to the method of the present invention cutting said flexible substrate, coated with a phosphor or scintillator layer into sheets or panels having desired formats, proceeds out of the vacuum chamber.

The method of the present invention is further characterized by the step of laminating said sheet or panel substrate carrying said phosphor or scintillator layer onto a carrier layer.

According to the method of the present invention said carrier layer is selected from the group consisting of a flexible or rigid polymer layer, a glass support, a carbon fibre plate and a rigid metal sheet.

Figure 2:
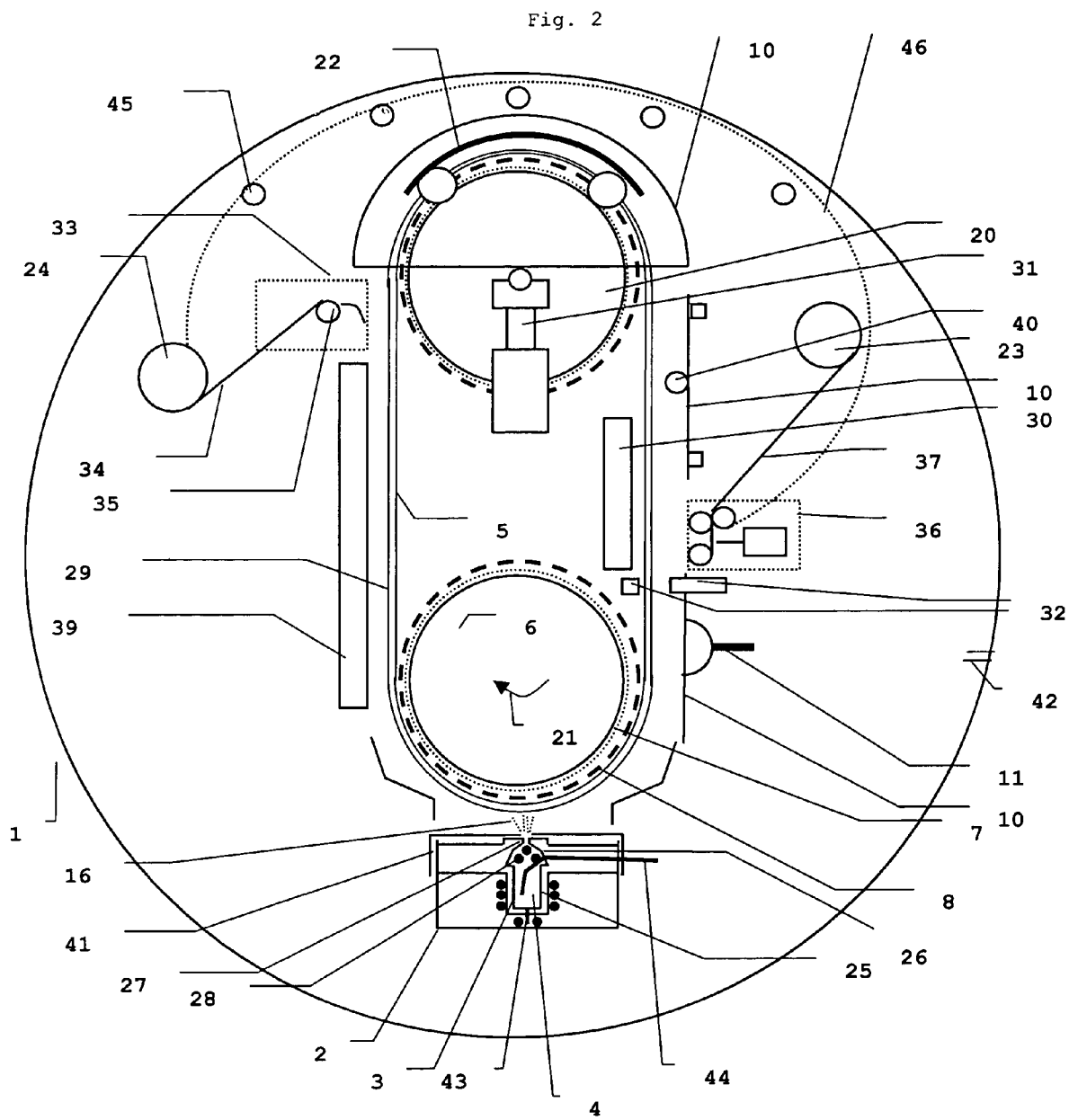
FIG. 2 as inventively improved arrangement shows a sealed zone acting as vacuum chamber (1), a flexible sheet (5) that is stretched around two conveying rollers, roller (6) being the lower and roller (20) being the upper conveying roller, moving in a direction as indicated by the arrow (21), through a vapor stream (16), provided by the mixture of raw materials (4) present in the crucible, tray or boat (3) provided with a container (25), an internally heated chimney (26) and a controllable outlet (27), heated to provide a vapor source generating said vapor stream (16), in order to provoke a phosphor layer to be deposited onto the flexible sheet (5) passing the vapor stream in (preferably continuous) multiple successive steps, wherein the flexible sheet (5) does not leave the vacuum chamber (1) and wherein at least during said step of vapor deposition the sealed zone is maintained under vacuum conditions. It is clear that the illustration is not limitative and that many configurations are possible within the space of the vacuum chamber (1) as has already been set out in the previously filed from EP-Application No. 03 100 723, dated Mar. 20, 2003.

In a common arrangement within the sealed zone under vacuum pressure (vacuum conditions corresponding with at least $10^{-1}$ mbar, and even down to $10^{-4}$ mbar or less if attainable as in the preferred configuration of the coating apparatus), the container is one crucible, preferably as described hereinbefore and as illustrated in FIG. 2. It is not excluded to make use of a plurality of crucibles, arranged in each direction of the two-dimensional, coated surface. Moreover it is recommended to make use of advantageous measures taken into account with respect to crucibles as described in EP-Applications Nos. 03 102 003 and 03 120 004, both filed Jul. 4, 2003.

It is evident that the composition of the raw material in the containers is chosen in order to provide a composition as desired, wherein said composition is determined by the ratios of raw materials present. Ratios of raw materials are chosen in order to provide the desired chemical phosphor or scintillator composition after deposition of the vaporized raw materials. It is desirable to mix the raw materials in order to get a homogeneous raw mix in the crucible(s) in form of solid powders, grains or granules, or as pastilles having a composition corresponding with the desired ratios of raw materials in order to provide the desired phosphor coated onto the moving substrate material. A milling procedure may be favorable in order to provide a high degree of homogeneity before vaporization and is therefore recommended. Differing components may also be vaporized from different crucibles, arranged in series or in parallel or in a combined arrangement as already suggested before, provided that a homogeneous vapor cloud is presented to the flexible substrate via the vapor stream or flow, deposited by condensation onto said substrate. Two elongated one-part boats having same or different raw material content or raw material mixtures may e.g. be present in series in the moving direction of the web. In another embodiment, if providing a more homogeneous coating profile, boats may be arranged in parallel on one axis or more axes, perpendicular to the moving direction of the support, provided that overlapping evaporation clouds again are providing a vapor stream that becomes deposited onto the support in a phosphor or scintillator layer having a homogeneous thickness, composition and coated amount of said phosphor or scintillator. Presence of more than one crucible may be in favor of ability to supply greater amounts of phosphor or scintillator material to be deposited per time unit, the more when the flexible substrate should pass the vapor flow at a rate, high enough in order to avoid too high temperature increase of the substrate. The velocity or rate at which the substrate passes the container(s) should indeed not be too slow in view of undesired local heating of the substrate support, making deposition impossible, unless sufficient cooling means are present in favor of condensation. The supporting or supported substrate should therefore preferably have a temperature between 50° C. and 300° C. in order to obtain deposited phosphor or scintillator layers having the desired optimized properties.

It is clear that energy should be supplied to one or more container(s), also known as crucible(s), tray(s) or boat(s), in order to provoke a vapor flow (or stream) of the raw materials present therein, which become vaporized in the sealed vacuum zone: energy is submitted thereto by thermal, electric, or electromagnetic energy sources. As an example of an electromagnetic energy source a diode, a cathodic arc, a laser beam, an electron beam, an ion beam, magnetron radiation or radio frequencies may be used, whether or not pulsed, without however being limited thereto. Electric energy is commonly provided by resistive heating, making use of resistance coils wound around the container(s) or crucible(s) in a configuration in order to get conversion into thermal energy, thereby providing heat transfer to the containers or crucibles filled with the raw materials that should be evaporated. Energy supply to an extent in order to heat the container(s) or crucible(s) up to a temperature in the range from 550–900° C. is highly desired. At those temperatures, it is clear that containers should resist corrosion, so that refractory containers are preferred. Preferred container or crucible materials therefor are tungsten, tantalum, molybdenum and other suitable refractory metals. Energy supply as set forth heats the mixture of raw materials in the crucible to a temperature above 450° C., preferably above 550° C., and even more preferably in the range of 550° C. up to 900° C.

A cloud of vaporized material, originating from the target raw materials thus escapes as a cloud in form of a flow or stream from the container(s) or crucible(s) in the direction of the moving substrate, where a coated layer is formed by condensation. From the description above it is clear that, in order to obtain a homogeneous coating profile as envisaged, a homogeneous cloud can only be realized when homogeneity is provided in the bulk of the liquefied raw material. As a consequence, a homogeneous distribution of energy supplied over the container is a stringent demand. In a preferred embodiment, in favor of homogeneity, the crucible is in form of a single elongated "boat" with a largest dimension corresponding with the width of the flexible support moving over the said crucible so that at each point of its surface area the momentarily velocity magnitude is constant.

If required during or after the deposition process oxygen can be introduced into the vacuum deposition chamber in form of oxygen gas via the argon gas inlet (42). More particularly an annealing step in between two deposition steps or at the end of the phosphor deposition may be benificial.

An important factor with respect to coating profile is the distance between container(s) and moving substrate as the distance determines the profile of the vapor cloud at the position of the flexible substrate. Average values of shortest distances between crucible(s) and substrate are preferably in the range of from 5 to 10 cm. Too large distances would lead to loss of material and decreased yield of the process, whereas too small distances would lead to too high a temperature of the substrate. Moreover care should further be taken with respect to avoiding "spot errors" or "pits", resulting in uneven deposit of phosphors or scintillators, due to spitting of the liquefied raw materials present in the heated container(s). Measures taken therefore have been illustrated in FIG. 2 and also those described in EP-Applications Nos. 03 102 003 and 03 102 004, both filed Jul. 4, 2003, are advantageously applied.

According to the method of the present invention said step of vapor depositing said phosphor or scintillator compositions is initiated by a vapor flow of raw materials from one or more crucible(s), and wherein said vapor flow is generated by adding energy to said raw materials and said container(s), by thermal, electric, or electromagnetic energy or a combination thereof.

According to the method of the present invention said step of vapor depositing said phosphor or scintillator compositions proceeds by physical vapor deposition, by chemical vapor deposition or a by combination of physical and chemical vapor deposition.

In another embodiment said phosphor is a photostimulable phosphor and, even more preferred according to the coating process of the present invention, said photostimulable (storage) phosphor is a CsBr:Eu phosphor. Related therewith and particularly preferred in the coating process according to the present invention, although not limited thereto at all, said raw materials are CsBr and between $10^{-3}$ and 5 mol % of a Europium compound selected from the group consisting of $EuX'_2$, $EuX'_3$ and $EuOX'$, $X'$ being a halide selected from the group consisting of F, Cl, Br and I as has been used in the preparation method disclosed in PCT-filing WO 01/03156. Even more preferred is the binderless coating process according to the present invention of the selected CsBr:Eu phosphor from CsBr and EuOBr raw materials, wherein the said phosphor is characterized by its particular needle-shaped form. The high degree of crystallinity is easily analysed by X-ray diffraction techniques, providing a particular XRD-spectrum as has been illustrated in EP-A 1 113 458. Therefore a mixture of CsBr and EuOBr is provided as a raw material mixture in the crucibles, wherein a ratio between both raw materials normally is about 90% by weight of the cheap CsBr and 10% of the expensive EuOBr, both expressed as weight %. It has however been shown that as a function of coating (evaporating) temperature ratios can be adapted in favor of lower material and production cost, without resulting in changes in composition: so higher vaporization temperatures for the raw material mixture in ratio amounts of 99.5 wt % CsBr and 0.5 wt % EuOBr provide the same result as before.

The preferred $CsBr:Eu^{2+}$ phosphor, obtained after vapor deposition as a needle-shaped phosphor, is characterized by voids between the needles. In order to fill those voids, measures can be taken as described in EP-A 1 347 460, wherein voids are partially filled with a polymeric compound; as in EP-A 1 349 177, wherein vapor deposited pigments like the preferred β-Cu-phthalocyanine nanocrystalline dye compound are filling said voids or as in EP-Application No. 03 100 471, filed Feb. 26, 2003, wherein the voids are at least partially filled with polymeric compounds selected from the group consisting of silazane and siloxazane type polymeric compounds, mixtures thereof and mixtures of said silazane or siloxazane type polymeric compounds with compatible polymeric compounds. More particularly with respect to the said dyes or pigments, vapor deposition thereof can be performed in the vacuum deposition chamber used in the configuration of the production method according to the present invention.

In order to prepare sheets or panel provided with the preferred CsBr:Eu$^{2+}$ phosphor, according to the method of the present invention said raw materials comprise, as phosphor precursors, at least $Cs_xEu_yX'_{x+\alpha y}$, wherein the ratio of x to y exceeds a value of 0.25, wherein $\alpha \geqq 2$ and wherein X' is a halide selected from the group consisting of Cl, Br and I and combinations thereof.

In another embodiment according to the method of the present invention said raw materials comprise, as phosphor precursors, at least CsBr and $Cs_xEu_yX'_{x+\alpha y}$, wherein the ratio of x to y exceeds a value of 0.25, wherein $\alpha \geqq 2$ and wherein X' is a halide selected from the group consisting of Cl, Br and I and combinations thereof.

Methods for preparing and coating desired CsBr:Eu phosphors, wherein use is made of precursors as set forth, have been described in EP-Applications Nos. 04 100 675 and 04 100 678 respectively, both filed Feb. 20, 2004.

According to the method of the present invention, at the moment of deposition, said phosphor or scintillator layer is a binderless layer. This can be well understood, as at those high temperatures, presence of additional binders besides phosphors or scintillators raw materials in the container(s) would not be practical. It is however not excluded to make use of polymers, showing ability to become vaporized, in order to serve as binder material e.g. between substrate and phosphor or scintillator layer or even between the preferred phosphor or scintillator needles in the coated layer. Moreover when laminating a polymer layer onto the deposited layer, it is not excluded that polymer material is filling, at least in part, the voids between those needles.

Even when no change in composition in the thickness direction is desired, it is clear that the raw material containing crucible(s) become exhausted during the physical vapor deposition process, set forth hereinbefore. Therefore "replenishment" of the crucible(s) should be provided, e.g. by addition of raw material components in powdery form, in form of grains or crystals or in form of pastilles containing caked powder or grain mixtures, in favor of maintaining homogeneity during the further evaporation process as otherwise, differences in dopant (Europium) concentrations may appear while the coating process is running furtheron. Methods in order to "reple-nish" the crucible(s) have e.g. been described in U.S. Pat. No. 4,430,366, in DE-A 1 98 52362 and in US-A 2003/0024479 A1.

In a further aspect related with the present invention it is not excluded to provide the phosphor or scintillator sheets or panels, before or after cutting in desired formats, with a moisture-resistant layer, in order to protect the moisture-sensitive phosphor layer against deterioration. Particularly preferred layers are e.g. parylene (p-xylylene) layers as described in EP-A 1 286 364, whether or not overcoated with a transparent organic layer of silazane or siloxazane type polymeric compounds or mixtures thereof as described in EP-Application No. 03 100 472, filed Feb. 26, 2003. In the method of applying a protecting parylene layer to phosphor or scintillator coatings as a "parylene layer" a halogen-containing layer was preferred. More preferably said "parylene layer" is selected from the group consisting of a parylene D, a parylene C and a parylene HT layer. In the particular case a cross-linked polymeric layer is advantageously formed on a phosphor screen material, wherein the said polymeric material layer has been formed by reaction of at least one component, thereby forming self-condensing polymers. Reactive monomers are provided in form of heated vapor in order to form the desired condensation polymer on the substrate, wherein said condensation polymer is in form of a p-xylylene or "parylene" layer on the phosphor screen substrate. Examples of these "parylene" layers are poly-p-xylylene (Parylene-N), poly-monochloro-p-xylylene (Parylene-C) and polydichloro-p-xylylene (Parylene-D). If desired a pigment can be integrated into a thin film of a poly-p-xylylene as has been described in JP-A 62-135520.

According to the method of the present invention said phosphor layer is a binderless layer of a photostimulable CsBr:Eu phosphor.

In another embodiment according to the method of the present invention said phosphor is a prompt emitting luminescent phosphor. Said luminescent phosphor is suitable for use e.g. in intensifying screens as used in screen/film radiography.

With respect to the specific application, related with CR and DR, it is clear that in view of image quality, and more particularly in view of sharpness, binderless phosphor or scintillator layers as described hereinbefore are preferred. With respect thereto it is clear that vaporization of raw materials in order to build the desired scintillators phosphors is a preferred technique, provided that, according to the present invention the layers have been deposited on a flexible substrate, as claimed, and wherein it is envisaged to deform the flexible support in order to get a flat sheet or panel, ready-for-use, suited for specific CR and DR applications. Other hygroscopic phosphor or scintillator layers besides the preferred CsBr:Eu phosphor that are advantageously prepared according to the method of the present invention are e.g. BaFCl:Eu, BaFBr:Eu and GdOBr:Tm, used in intensifying screens; CsI:Na applied in scintillator panels and storage phosphors suitable for use in computed radiography (CR) as e.g. BaFBr:Eu, BaFI:Eu, (Ba,Sr)F(Br,I):Eu, RbBr:Tl, CsBr:Eu, CsCl:Eu and RbBr:Eu; or CsI:Tl, which is particularly suitable for use in DR-cassettes.

While the present invention will hereinafter be described in connection with preferred embodiments thereof, it will be understood that it is not intended to limit the invention to those embodiments.

EXAMPLES

Comparative Example 1

This example describes the state-of-the art method performed in order to obtain a photostimulable CsBr:Eu imaging plate.

A CsBr:Eu photostimulable phosphor layer was deposited in a vacuum chamber via thermal vapor deposition on a flat rigid aluminum support that rotates around an axis perpendicular to and going through the centre of the support starting from a mixture of CsBr and EuOBr as raw materials. While rotating said support its momentary velocity magnitude is highest at the outside (at the boundary) of the support and zero in the centre of the support.

The support was heated with the aid of a resistively heated heating plate having a temperature of 240° C.

The support was aluminum having a thickness of 800 μm, a width of 18 cm and a length of 24 cm. The aluminum support was mounted, against a substrate holder, rotating in a controlled way by means of a motor, around its axis. The aluminum was rotating with an angular speed of 12 rotations per minute. The support was heated by means of a resistively heated heating plate at 240° C.

A mixture of CsBr and EuOBr, in a CsBr/EuOBr 99.5%/0.5% ratio by weight percentage was used as a raw material mixture to become vaporized and was placed in two containers. The distance between the containers and the substrate was about 15 cm. The containers were placed at the circumference of a circle described by an edge of the rotating substrate. The containers were covered with a cover plate having one slit therein and a guiding plate, guiding the vapor stream towards the substrate.

Under vacuum pressure (a pressure of $2\times10^{-1}$ Pa was maintained as an equilibrium between a continuous inlet of argon gas into the vacuum chamber and continuous pumping) and at a sufficiently high temperature of the vapor source (750° C.) the obtained vapor was directed towards the rotating substrate and was deposited thereon.

A CsBr:Eu stimulable phosphor layer having an average thickness of 500 μm was deposited over the entire area of the support.

Only 13% by weight of the evaporated material was deposited onto the support.

An area of 0.043 m², suitable for practical use, was obtained.

The stimulable phosphor layer shows a blue luminescence under UV radiation.

Inventive Example 1

A CsBr:Eu photostimulable phosphor screen having a flexible anodized aluminum was prepared in a vacuum chamber by means of a thermal vapor deposition process, starting from a mixture of CsBr and EuOBr as raw materials. Said deposition process onto said flexible anodized aluminum support was performed in such a way that said support was moving so that the momentary magnitude of the velocity was constant over its whole area.

Referring to FIG. 2 the cylindrical vacuum chamber (1) with a diameter of 1.4 m and a length of 1.75 m was containing an electrically heated oven (2) and a refractory tray or boat (3) in which 4 kg of a mixture (4) of CsBr and EuOBr as raw materials in a 99.5%/0.5% CsBr/EuOBr percentage ratio by weight were present to become vaporized.

Crucible (3) was an elongated boat composed of "tantalum" having a thickness of 0.5 mm composed of 3 parts: a crucible container (25), an internally heated chimney (26) and a controllable outlet (27), the longitudinal parts of which are folded from one continuous tantalum base plate in order to overcome leakage. The chimney was provided with heaters (28) in order to heat the chimney in order to overcome condensation of vaporized materials. Moreover the chimney heaters (28) were positioned in a baffled way in order to overcome spatter of molten or vaporized material onto the substrate into an uncontrolled and unlimited way. A lip opening of 5 mm as controllable outlet (27) was used. A heat shield (41) with slit opening was further shielding heat in order to avoid escape of heat and loss of energy, required to provoke vapor escape and deposit onto the continuously moving substrate support in a controlled and uniform way.

Under vacuum pressure (a pressure of $2\times10^{-1}$ Pa equivalent with $2\times10^{-3}$ mbar) maintained by a continuous inlet (42) of argon gas into the vacuum chamber (1), and at a sufficiently high temperature of the vapor source (760° C.) and the chimney (26) the obtained vapor was directed towards the moving sheet support (5) and was deposited thereupon successively while said support was moving along the vapor stream (16). Said temperature of the vapor source was measured by means of thermocouples (43) present outside and pressed under the bottom of said crucible and tantalum protected thermocouples (44) present in the crucible and in the chimney (26).

The anodized aluminum substrate support (5) having a thickness of 280 μm, a width of 1.04 m and a length of 2.50 m, together with a protection foil (29) was mounted onto the anodized side around two cylindrical support rollers (6) and (20), both having a diameter of 40 cm and a length of 1.18 m. The said anodized side was positioned at the side whereupon the phosphor should be deposited. The support (5) was correctly positioned by means of the suction table (30) that was present in the machine. The two ends of the support were glued together with a heat resistant adhesive and with one or more rivets. The tension on the support was further controlled by regulating the pressure on two cylinders (31) that push up the upper support roller (20). Such a system moreover avoids or compensates for a loss of tension during heating up the anodized aluminum support, due to thermal expansion of the support. The lower roller (6) was rotating in a controlled way by means of a motor around its axis, whereas the upper roller was rotating by means of the support, moving by the rotating lower roller (6). Under vacuum, during rotation, the position of the support on the rollers could be controlled by means of an optical positioning sensor (32)(placed in vacuum), coupled back to pressure regulating cylinder(s) (31) provided for pushing up the upper carrier roller (20). The anodized aluminum was moving with a constant linear velocity of 20 m per minute.

The lower cylindrical carrier roller (6) and the upper carrier roller (20) were thermally isolated from the substrate support sheet (5) by means of a thermal isolation layer (7) and by means of heat-resistant coiled springs (8), that were mounted over the length of the cylinder in such a way that the coiled springs make an angle of 30° with a line, parallel with the axis of the cylinder.

The protection foil (29) for the aluminum was removed once the support was on tension.

In another experiment it was removed under vacuum by making use of a delamination unit (33) present in the vacuum chamber (1). Delamination was made possible by the use of a delamination forerunner (34), mounted over one or more delamination rollers (35) to the delamination roller (24) on one side and connected to the protection foil (29) on the other side.

In still another experiment, the forerunner was hooked or fastened to the protection foil under vacuum.

Delamination of the protection foil under vacuum was particular advantageous in that there was no risk to get dust in the meantime become deposited onto the film before the vacuum cyclus was started.

In another experiment before vacuum deposition of the phosphor the anodized aluminium was treated with a corona discharge treatment over the whole width in order to further remove dirt, optionally present, as e.g. from residues of protection foil and/or from the substrate.

The temperature of the support (5) was maintained in the vicinity of 200° C. (±10° C.). The temperature was measured over the whole width of the roller with 5 pyrometers. In order to overcome misleading temperature measurements due to failures by measuring of heating effects by reflection of environmental heat radiation, use was made of lens based pyrometers with a parabolic reflector on top (38). In order to obtain a good reflection in the reflector a gold evaporated mirror was used. The focus of the parabolic reflector was directed in order to coincide with the focus of the pyrometer lens. The temperature of the substrate was regulated by means of regulable infrared heater(s) (40) and by an adressable cooling unit (39) installed along the support. As infrared heaters (40) used was made of quarts lamps. Those lamps were always adressed at full power in order to provide energy emission within a wavelength spectrum, matching the absorption spectrum of the aluminum substrate support. The effective heat radiation time was regulated by a 7 level time modulation regulation (regulation of the "on" and the "off" term of the lamps). Those lamps were placed horizontally along the support with a reflecting screen behind it. In addition two small quartz lamps with a reflecting screens behind it, were used at the edges, in order to reduce temperature differences between the middle and the edges of the plate. These lamps were arranged in such a way that an angle was made of 60° with the large longitudinal quartz lamp.

In another experiment a battery of small infrared lamps that are separately adressable were used as heating system (40). The power of each lamp was steered by an automatic back-coupling to the measured temperature (38). In this way a satisfying temperature profile could be obtained over the whole width of the substrate.

In order to provide efficient heating, the support was surrounded by a reflector cage (10) for reventing loss of heat radiation. That reflector cage (10) was made of reflecting material (aluminum in this case), taking into account spatial limitations and bypassing obstacles as much as possible.

In order to overcome excessive temperature increase while depositing vaporized phosphor or scintillator material, the substrate was cooled, by means of an adressable cooling unit (39), installed along and over the full width of the support. The cooling unit was addressable as it could be made effective or not by "switching" in an "on" or "off" position. Therefore it was build up of a black body 10 cooling element, cooled with water at room temperature on the backside, and of an addressable (opened, closed) screen of louvers (multiple slats) on the front or support side. The slats were placed with their long side along the moving direction of the support, partly overlapping each other, providing ability to be reflective on the front side, and is ability to become rotated altogether along their long axis. In the "cooling-off" position ("closed" position) the reflecting surface of the slats were directed towards the support in order to keep the heat preserved in the support, whereas in the "cooling-on" position the slats were rotated altogether over 90° in order to open the screen, so that the cool black body behind the screen could provide cooling of the support.

A CsBr:Eu stimulable phosphor layer having an average thickness of 640 μm was, within a time of 45 minutes, deposited over the entire length of the support in successive steps, during which the thickness of the deposited layer was increasing. Each site of the support was successively passing more times the vapor stream over the refractory boat or tray. The layer was thereby growing with an increasing thickness per each rotation, wherein said increasing thickness was measured on-line by a thickness measuring apparatus (22), based on capacitance measurements: changes in capacitance were introduced by the growing phosphor layer, measured between 2 electrodes (one of which, connected with the upper carrier roll was set on ground potential). As a result, in order to give an idea about homogeneity of the deposited layer onto the support, a variety in thicknesses in the range between 594 μm and 691 μm was obtained over the whole width thereof.

The stimulable phosphor layer was showing a blue luminescence under UV radiation again.

Panels having the desired size, as e.g. 35 cm×45 cm, were cut out of the above described large plate with a good edge quality. The cutted panels were then laminated against a rigid flat glass plate without damage of the layer, making use therefor of a transferable adhesive.

In the same way as described hereinbefore sizes of the vacuum deposited plates were increased up to an area of more than 2 m² by increasing the length of the anodized aluminum support to more than 2.74 m. This was performed by increasing the diameter of the support roller (6) from 0.4 m to 0.9 m.

Example 2

Same experiments were performed as in the inventive Example 1, except for the temporary protection, after the deposition of the needle-shaped phosphor imaging layer, by a laminate, provided by lamination of said imaging layer in vacuum. In this way the material was protected in order to be safely moved out of the vacuum chamber. The material could also be cut in the presence of the laminate so that contamination with debri or dust was made impossible. After cutting, the temporary protection laminate was removed by delamination. During delamination, debri or dust, present on the cutting edges, stuck to the laminate and did not contaminate the material.

Example 3

Same experiments were performed as in the inventive Example 1, except for the protection, after the deposition of the needle-shaped phosphor imaging layer, by a laminate, provided by lamination in vacuum of said imaging layer with a lasting protection layer, originating from a lamination package. In this experiment the lamination package was consisting of a siliconized polyethylene terephthalate release layer, an adhesive layer and the protection foil. The lamination package was passing the laminate unit (36) with mechanism for supplying laminate foil and the protective foil was delaminated from the release layer (siliconized polyethylene terephthalate) to become laminated onto the vapor deposited phosphor layer. As this operation proceeded in vacuum the phosphor layer was remaining dust free. The release layer was further guided over the guiding rollers (45) to the same delamination collecting roller as used for delamination of the initial laminate present on the protected substrate support.

The sheet or panel protected with the lasting protective layer could further be cut in the presence of the lasting protective laminate layer so that contamination with debri or dust was made impossible.

Having described in detail preferred embodiments of the current invention, it will now be apparent to those skilled in the art that numerous modifications can be made therein without departing from the scope of the invention as defined in the appending claims.

PARTS LIST (1) vacuum chamber
(2) oven
(3) crucible, tray or boat
(4) mixture of raw materials
(5) sheet
(6) conveying carrier roller
(7) thermal isolation layer
(8) cylindrical springs
(9) infrared heater
(10) reflector cage
(11) pyrometer
(12) baffle
(13) baffle

(14) metallic raster
(15) separation plates
(16) vapor stream
(17) baffle
(18) evaporation part
(19) heating part
(20) upper conveying carrier roller
(21) travelling pathway
(22) thickness measuring system
(23) unwinding roller (supplying laminate roller)
(24) upwinding roller (collecting initial laminated protective foil on substrate)
(25) crucible container
(26) internally heated chimney
(27) controllable outlet
(28) chimney heaters
(29) initial delaminated protection foil
(30) (optionally vacuum) suction table
(31) pressure regulating cylinder(s)
(32) optical positioning sensor
(33) delamination collecting roller for delaminate foil (for initial laminate on substrate, and, optionally for release layer of lamination package for laminating deposited phosphor or scintillator layer)
(34) delamination forerunner
(35) delamination rollers
(36) lamination unit to apply protection foil after vapor deposition
(37) protection foil to be laminated after vapor deposition step
(38) pyrometers
(39) cooling unit
(40) heating system
(41) heat shield with slit
(42) gas inlet
(43) thermocouples
(44) protected thermocouples
(45) guiding rollers
(46) laminate release foil (optional)

What is claimed is:

1. A method for preparing a plurality of phosphor or scintillator sheets or panels having flexible supports or substrates by coating a phosphor or scintillator layer within a sealed zone, wherein said zone comprises at least two cylindrical carrier rollers for carrying a flexible substrate exceeding dimensional formats of desired phosphor or scintillator sheets or panels with a factor of at least 5, wherein said cylindrical carrier rollers each have an axis in a parallel arrangement with one another; wherein said zone comprises at least one crucible containing a mixture of raw materials providing desired phosphor or scintillator compositions for said layer; and wherein said zone comprises a laminating unit; wherein said method comprises the steps of mounting said flexible substrate onto said carrier rollers, vapor depositing said phosphor or scintillator layer having a desired phosphor or scintillator composition onto said flexible substrate, and laminating said phosphor or scintillator layer, thereby covering said layer with a protective foil; further comprising the step of cutting said layer into sheets or panels having desired formats, and wherein at least during said vapor depositing step said zone is maintained under vacuum conditions as a vacuum chamber.

2. Method according to claim 1, wherein said zone further comprises a delaminating unit, and wherein a step of delaminating said flexible substrate, when provided with an initial protective laminate foil, is included, before said step of vapor depositing said phosphor or scintillator composition.

3. Method according to claim 1, wherein said laminating said phosphor or scintillator layer and a step of delaminating said flexible substrate are both performed under vacuum conditions.

4. Method according to claim 2, wherein said steps of laminating said phosphor or scintillator layer and said step of delaminating said flexible substrate are both performed under vacuum conditions.

5. Method according to claim 1, wherein said flexible substrate support is an anodized aluminum support layer, covered with a protective foil.

6. Method according to claim 2, wherein said flexible substrate support is an anodized aluminum support layer, covered with a protective foil.

7. Method according to claim 3, wherein said flexible substrate support is an anodized aluminum support layer, covered with a protective foil.

8. Method according to claim 4, wherein said flexible substrate support is an anodized aluminum support layer, covered with a protective foil.

9. Method according to claim 5, wherein said anodized aluminum support layer has a thickness in the range of from 50 to 500 µm.

10. Method according to claim 6, wherein said anodized aluminum support layer has a thickness in the range of from 50 to 500 µm.

11. Method according to claim 7, wherein said anodized aluminum support layer has a thickness in the range of from 50 to 500 µm.

12. Method according to claim 8, wherein said anodized aluminum support layer has a thickness in the range of from 50 to 500 µm.

13. Method according to claim 1, wherein in said mounting step two ends of the substrate support are glued together with a heat resistant adhesive, with one or more rivets or with a combination thereof.

14. Method according to claim 2, wherein in said mounting step two ends of the substrate support are glued together with a heat resistant adhesive, with one or more rivets or with a combination thereof.

15. Method according to claim 1, wherein one carrier roller is rotating, in a controlled way, by means of a motor around its axis, whereas other roller(s) is(are) rotating by movement of said one roller; and wherein while rotating, the position of the flexible substate on the rollers is controlled by means of an optical positioning sensor, coupled back to pressure regulating cylinder(s), providing position adjustment of said flexible substrate.

16. Method according to claim 2, wherein one carrier roller is rotating, in a controlled way, by means of a motor around its axis, whereas other roller(s) is(are) rotating by movement of said one roller; and wherein while rotating, the position of the flexible substate on the rollers is controlled by means of an optical positioning sensor, coupled back to pressure regulating cylinder(s), providing position adjustment of said flexible substrate.

17. Method according to claim 2, wherein said protective laminate foil, initially laminated onto the said flexible substrate, is removed in said delaminating step, once said flexible substrate has been put on tension.

18. Method according to claim 4, wherein said protective laminate foil, initially laminated onto the said flexible substrate, is removed in said delaminating step, once said flexible substrate has been put on tension.

19. Method according to claim 6, wherein said protective laminate foil, initially laminated onto the said flexible substrate, is removed in said delaminating step, once said flexible substrate has been put on tension.

20. Method according to claim 8, wherein said protective laminate foil, initially laminated onto the said flexible substrate, is removed in said delaminating step, once said flexible substrate has been put on tension.

21. Method according to claim 10, wherein said protective laminate foil, initially laminated onto the said flexible substrate, is removed in said delaminating step, once said flexible substrate has been put on tension.

22. Method according to claim 12, wherein said protective laminate foil, initially laminated onto the said flexible substrate, is removed in said delaminating step, once said flexible substrate has been put on tension.

23. Method according to claim 14, wherein said protective laminate foil, initially laminated onto the said flexible substrate, is removed in said delaminating step, once said flexible substrate has been put on tension.

24. Method according to claim 16, wherein said protective laminate foil, initially laminated onto the said flexible substrate, is removed in said delaminating step, once said flexible substrate has been put on tension.

25. Method according to claim 17, wherein said protective laminate foil is removed under vacuum by delamination, making use of a delamination unit present in the vacuum chamber.

26. Method according to claim 18, wherein said protective laminate foil is removed under vacuum by delamination, making use of a delamination unit present in the vacuum chamber.

27. Method according to claim 19, wherein said protective laminate foil is removed under vacuum by delamination, making use of a delamination unit present in the vacuum chamber.

28. Method according to claim 20, wherein said protective laminate foil is removed under vacuum by delamination, making use of a delamination unit present in the vacuum chamber.

29. Method according to claim 21, wherein said protective laminate foil is removed under vacuum by delamination, making use of a delamination unit present in the vacuum chamber.

30. Method according to claim 22, wherein said protective laminate foil is removed under vacuum by delamination, making use of a delamination unit present in the vacuum chamber.

31. Method according to claim 23, wherein said protective laminate foil is removed under vacuum by delamination, making use of a delamination unit present in the vacuum chamber.

32. Method according to claim 24, wherein said protective laminate foil is removed under vacuum by delamination, making use of a delamination unit present in the vacuum chamber.

33. Method according to claim 1, wherein said carrier rollers are thermally isolated from said flexible substrate support by means of a thermal isolation layer and/or a plurality of heat-resistant coiled springs, mounted over the length of the cylinders in such a way that the said coiled springs make an angle in the range of 20° to 40° with a line, parallel with the axis of said cylindrical carrier rollers.

34. Method according to claim 2, wherein said carrier rollers are thermally isolated from said flexible substrate support by means of a thermal isolation layer and/or a plurality of heat-resistant coiled springs, mounted over the length of the cylinders in such a way that the said coiled springs make an angle in the range of 20° to 40° with a line, parallel with the axis of said cylindrical carrier rollers.

35. Method according to claim 1, wherein during said vapor depositing step the temperature of the said flexible substrate is maintained in the range from 150° to 300° by means of regulable heaters and by an addressable cooling unit installed along the support.

36. Method according to claim 2, wherein during said vapor depositing step the temperature of the said flexible substrate is maintained in the range from 150° to 300° by means of regulable heaters and by an addressable cooling unit installed along the support.

37. Method according to claim 35, wherein said cooling unit is build up of a black body cooling element, cooled with water at room temperature on the backside, and of an addressable (opened or closed) screen of louvers in form of multiple slats on the front or support side of said cooling element.

38. Method according to claim 36, wherein said cooling unit is build up of a black body cooling element, cooled with water at room temperature on the backside, and of an addressable (opened or closed) screen of louvers in form of multiple slats on the front or support side of said cooling element.

39. Method according to claim 35, wherein said temperature is measured over the whole width of said flexible substrate by means of a set of pyrometers.

40. Method according to claim 36, wherein said temperature is measured over the whole width of said flexible substrate by means of a set of pyrometers.

41. Method according to claim 37, wherein said temperature is measured over the whole width of said flexible substrate by means of a set of pyrometers.

42. Method according to claim 38, wherein said temperature is measured over the whole width of said flexible substrate by means of a set of pyrometers.

43. Method according to claim 35, wherein said temperature is measured and registrated and wherein a temperature profile over the whole width of said flexible substrate is used as input for steering substrate heating and/or substrate cooling.

44. Method according to claim 36, wherein said temperature is measured and registrated and wherein a temperature profile over the whole width of said flexible substrate is used as input for steering substrate heating and/or substrate cooling.

45. Method according to claim 37, wherein said temperature is measured and registrated and wherein a temperature profile over the whole width of said flexible substrate is used as input for steering substrate heating and/or substrate cooling.

46. Method according to claim 38, wherein said temperature is measured and registrated and wherein a temperature profile over the whole width of said flexible substrate is used as input for steering substrate heating and/or substrate cooling.

47. Method according to claim 39, wherein said temperature is measured andregistrated and wherein a temperature profile over the whole width of said flexible substrate is used as input for steering substrate heating and/or substrate cooling.

48. Method according to claim 40, wherein said temperature is measured and registrated and wherein a temperature profile over the whole width of said flexible substrate is used as input for steering substrate heating and/or substrate cooling.

49. Method according to claim 41, wherein said temperature is measured and registered and wherein a temperature profile over the whole width of said flexible substrate is used as input for steering substrate heating and/or substrate cooling.

50. Method according to claim 42, wherein said temperature is measured and registered and wherein a temperature profile over the whole width of said flexible substrate is used as input for steering substrate heating and/or substrate cooling.

51. Method according to claim 1, wherein said sealed zone further comprises as a controlling part a thickness measuring system, determining thickness while vapor depositing said scintillator or phosphor layer, wherein said measuring system is based on capacitance measurements.

52. Method according to claim 2, wherein said sealed zone further comprises as a controlling part a thickness measuring system, determining thickness while vapor depositing said scintillator or phosphor layer, wherein said measuring system is based on capacitance measurements.

53. Method according to claim 1, wherein the said flexible substrate is spatially surrounded by a reflector cage for heat radiation.

54. Method according to claim 2, wherein the said flexible substrate is spatially surrounded by a reflector cage for heat radiation.

55. Method according to claim 1, wherein said protective foil, provided by the step of laminating said foil after depositing said phosphor or scintillator layer is a temporary protection layer removed by a delaminating step before or after cutting; or a lasting protective foil layer.

56. Method according to claim 2, wherein said protective foil, provided by the step of laminating said foil after depositing said phosphor or scintillator layer is a temporary protection layer removed by a delaminating step before or after cutting; or a lasting protective foil layer.

57. Method according to claim 1, wherein said protective foil, provided by the step of laminating said foil after depositing said phosphor or scintillator layer is a lasting protection layer, wherein said lasting protection layer is provided from a protection layer package, comprising a release layer that is removed in a further delaminating step and that is winded up on an upwinding roller.

58. Method according to claim 2, wherein said protective foil, provided by the step of laminating said foil after depositing said phosphor or scintillator layer is a lasting protection layer, wherein said lasting protection layer is provided from a protection layer package, comprising a release layer that is removed in a further delaminating step and that is winded up on an upwinding roller.

59. Method according to claim 2, wherein said protective foil, provided by the step of laminating said foil after depositing said phosphor or scintillator layer is a lasting protection layer, wherein said lasting protection layer is provided from a protection layer package, comprising a release layer removed in a further delaminating step by means of the same delaminating unit used during the delaminating step of said flexible substrate, when initially provided with a protective laminate foil.

60. Method according to claim 1, wherein cutting said flexible substrate, coated with a phosphor or scintillator layer into sheets or panels having desired formats, proceeds out of the vacuum chamber.

61. Method according to claim 2, wherein cutting said flexible substrate, coated with a phosphor or scintillator layer into sheets or panels having desired formats, proceeds out of the vacuum chamber.

62. Method according to claim 1, further characterized by the step of laminating said sheet or panel substrate carrying said phosphor or scintillator layer onto a carrier layer.

63. Method according to claim 2, further characterized by the step of laminating said sheet or panel substrate carrying said phosphor or scintillator layer onto a carrier layer.

64. Method according to claim 62, wherein said carrier layer is selected from the group consisting of a flexible or rigid polymer layer, a glass support, a carbon fibre plate and a rigid metal sheet.

65. Method according to claim 63, wherein said carrier layer is selected from the group consisting of a flexible or rigid polymer layer, a glass support, a carbon fibre plate and a rigid metal sheet.

66. Method according to claim 1, wherein said step of vapor depositing said phosphor or scintillator compositions is initiated by a vapor flow of raw materials from one or more crucible(s), and wherein said vapor flow is generated by adding energy to said raw materials and said container(s), by thermal, electric, or electromagnetic energy or a combination thereof.

67. Method according to claim 2, wherein said step of vapor depositing said phosphor or scintillator compositions is initiated by a vapor flow of raw materials from one or more crucible(s), and wherein said vapor flow is generated by adding energy to said raw materials and said container(s), by thermal, electric, or electromagnetic energy or a combination thereof.

68. Method according to claim 1, wherein said step of vapor depositing said phosphor or scintillator compositions proceeds by physical vapor deposition, by chemical vapor deposition or a by combination of physical and chemical vapor deposition.

69. Method according to claim 2, wherein said step of vapor depositing said phosphor or scintillator compositions proceeds by physical vapor deposition, by chemical vapor deposition or a by combination of physical and chemical vapor deposition.

70. Method according to claim 1, wherein said raw materials comprise, as phosphor precursors, at least $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

71. Method according to claim 2, wherein said raw materials comprise, as phosphor precursors, at least $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

72. Method according to claim 1, wherein said raw materials comprise, as phosphor precursors, at least CsBr and $Cs_xEu_yX'_{x+\alpha y}$, wherein the ratio of x to y exceeds a value of 0.25, wherein $\alpha \geq 2$ and wherein X' is a halide selected from the group consisting of Cl, Br and I and combinations thereof.

73. Method according to claim 2, wherein said raw materials comprise, as phosphor precursors, at least CsBr and $Cs_xEu_yX'_{x+\alpha y}$, wherein the ratio of x to y exceeds a value of 0.25, wherein $\alpha \geqq 2$ and wherein X' is a halide selected from the group consisting of Cl, Br and I and combinations thereof.

74. Method according to claim 1, wherein wherein said phosphor layer is a binderless layer of a photostimulable CsBr:Eu phosphor.

75. Method according to claim 2, wherein wherein said phosphor layer is a binderless layer of a photostimulable CsBr:Eu phosphor.

* * * * *